United States Patent [19]

Tokuyama

[11] Patent Number: 5,444,001

[45] Date of Patent: Aug. 22, 1995

[54] METHOD OF MANUFACTURING A SEMICONDUCTOR DEVICE READILY CAPABLE OF REMOVING CONTAMINANTS FROM A SILICON SUBSTRATE

[75] Inventor: Michiko Tokuyama, Tokyo, Japan

[73] Assignee: NEC Corporation, Tokyo, Japan

[21] Appl. No.: 172,248

[22] Filed: Dec. 23, 1993

[30] Foreign Application Priority Data

Dec. 25, 1992 [JP] Japan .................. 4-347134

[51] Int. Cl.6 ........................................ H01L 21/306
[52] U.S. Cl. ............................ 437/10; 437/12; 437/61; 437/62
[58] Field of Search ............... 437/10, 12, 61, 62

[56] References Cited

U.S. PATENT DOCUMENTS

| | | |
|---|---|---|
| 4,053,335 | 10/1977 | Hu . |
| 4,144,099 | 3/1979 | Edmonds et al. ............... 437/10 |
| 4,506,434 | 3/1985 | Ogawa et al. .................. 437/10 |
| 4,608,096 | 8/1986 | Hill . |
| 4,766,086 | 8/1988 | Ohshima et al. . |
| 4,828,629 | 5/1989 | Ikeda et al. . |
| 5,130,260 | 7/1992 | Suga et al. ..................... 437/10 |
| 5,189,508 | 2/1993 | Tachimori et al. ............. 257/49 |

FOREIGN PATENT DOCUMENTS

| | | |
|---|---|---|
| 0030457 | 6/1981 | European Pat. Off. . |
| 3910185 | 10/1989 | Germany . |
| 0135128 | 6/1986 | Japan .................. 437/12 |
| 0159741 | 7/1986 | Japan .................. 437/12 |
| 0026826 | 2/1987 | Japan .................. 437/12 |
| 0298726 | 12/1989 | Japan .................. 437/10 |
| 0315144 | 12/1989 | Japan .................. 437/10 |
| 0154346 | 7/1991 | Japan .................. 437/12 |

*Primary Examiner*—Brian E. Hearn
*Assistant Examiner*—Lynne A. Gurley
*Attorney, Agent, or Firm*—Young & Thompson

[57] ABSTRACT

For removing contaminants (32) from a silicon substrate (31) having a principal surface (31a), a polycrystalline silicon film (34) is formed on an oxidation film (33) which is formed by oxidizing the principal surface. Selective oxidation is used. As a result, the contaminants are mainly concentrated around an interface between the oxidation and the polycrystalline silicon films. Thereafter, the oxidation and the polycrystalline silicon films are deleted from the silicon substrate. Therefore, the contaminants are eliminated from the silicon substrate together with the oxidation and the polycrystalline silicon films.

6 Claims, 10 Drawing Sheets

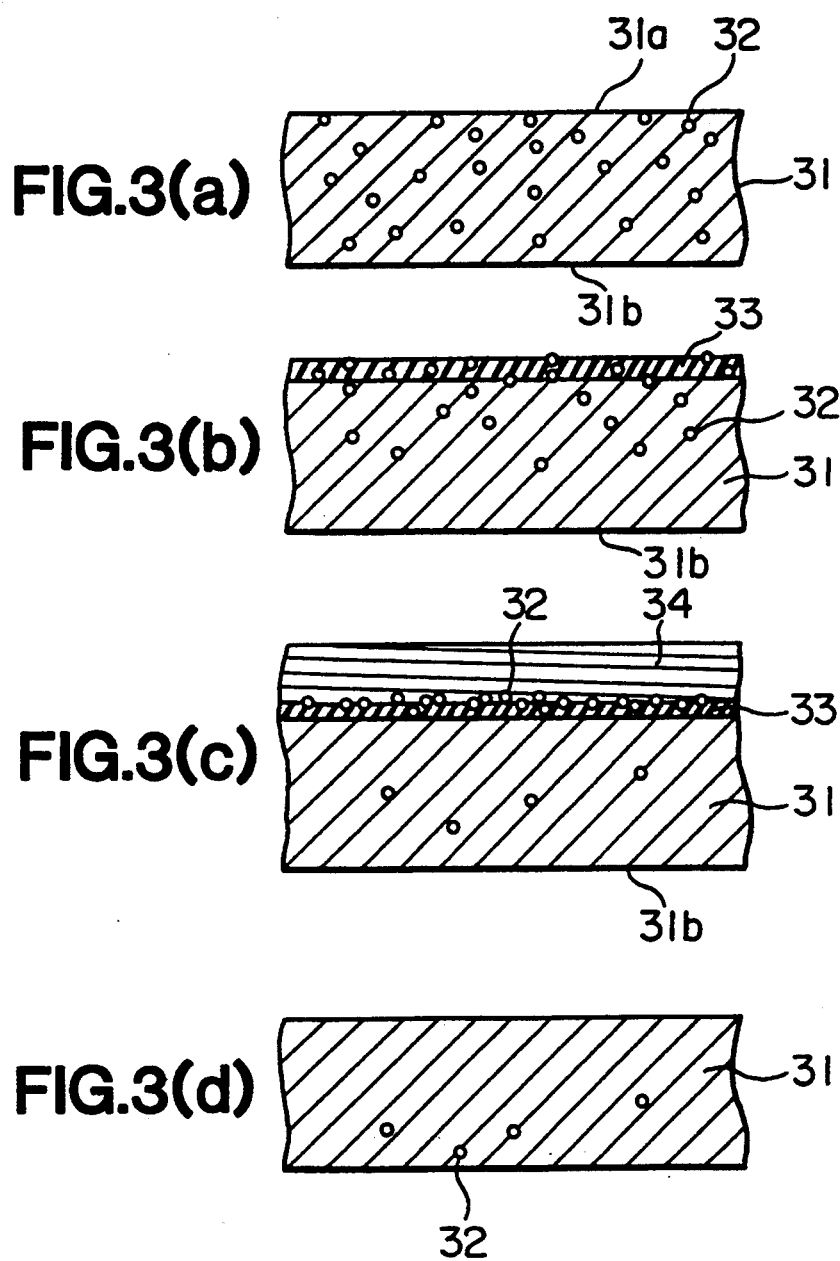

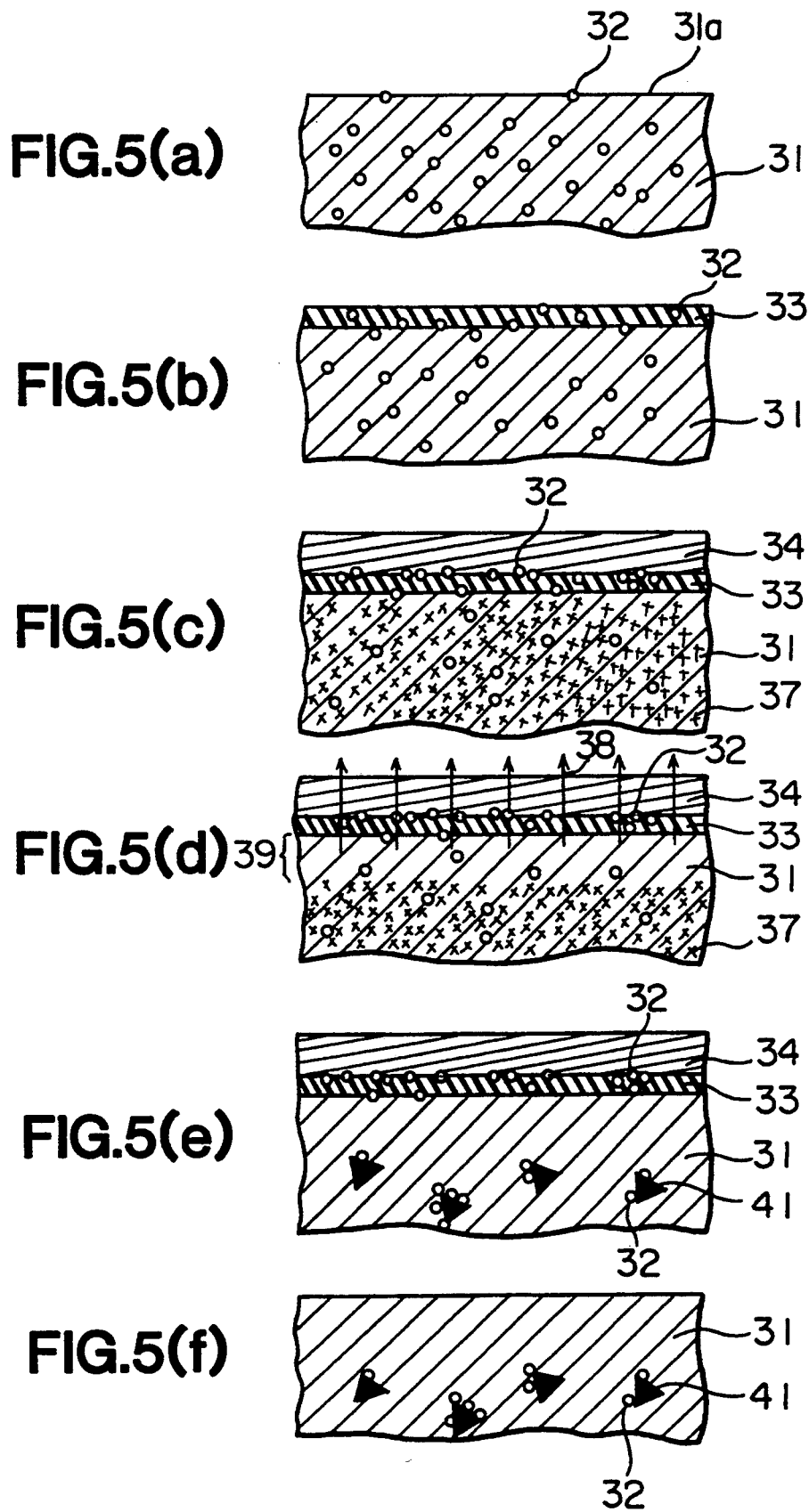

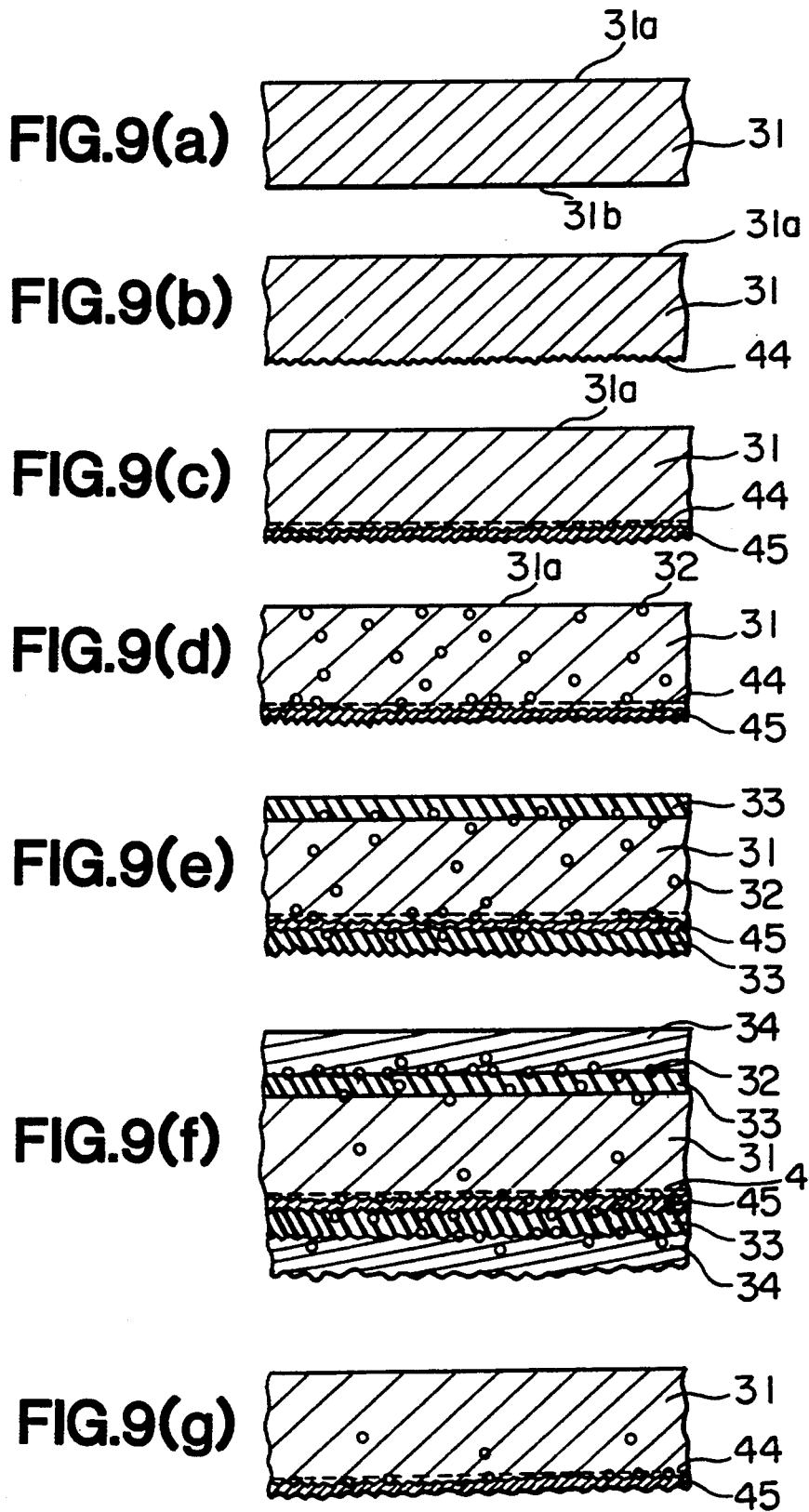

METHOD OF MANUFACTURING A SEMICONDUCTOR DEVICE READILY CAPABLE OF REMOVING CONTAMINANTS FROM A SILICON SUBSTRATE

BACKGROUND OF THE INVENTION

This invention relates to a method of manufacturing a semiconductor device from a silicon substrate.

In the manner known in the art, such a semiconductor device has a principal surface and an opposite surface opposite to the principal surface and includes a circuit element formed in a particular area, namely, a circuit element forming area through the principal surface. For manufacturing the semiconductor device, it is necessary to reduce contaminants, such as heavy metal, which are existent in the silicon substrate. This is because the contaminants result in deterioration of characteristics of the circuit element when they are existent in the silicon substrate.

To remove the contaminants from the silicon substrate, use is generally made of a process such as intrinsic gettering process (hereinafter abbreviated to an IG process) or extrinsic gettering process (hereinafter abbreviated to an EG process).

In the IG process, the contaminants are trapped in oxygen which is precipitated inside the silicon substrate, so that the amount of the contaminants is reduced from the particular area of the silicon substrate.

In order to precipitate the oxygen inside the silicon substrate, a first heat treatment is at first carried out as regards the silicon substrate at a high temperature to reduce oxygen concentration in the particular area of the silicon substrate. The first heat treatment is followed by a second heat treatment which is carried out at a low temperature for precipitating nuclei. Next, the second heat treatment is followed by a third heat treatment which is carried out at another high temperature for growing each of the nuclei to precipitate the oxygen. The oxygen concentration of $1-2 \times 10^{18}$ atoms/cm$^3$ is required in order to effectively carry out the IG process.

Next, the EG process will be described in the following. The silicon substrate has an opposite surface opposite to the principal surface. In the EG process, crystal loss is introduced in the opposite surface to trap the contaminants therein.

Introduction of the crystal loss is carried out prior to or during formation of the circuit element. Various methods can be used therefor. In a back side damaging method, a physical damage is given to the opposite surface of the silicon substrate by the use of fine particles such as SiO sprayed onto the opposite surface of the silicon substrate or a laser beam irradiated onto the opposite surface to melt and solidify the opposite surface. In an ion implantation method, the opposite surface is subjected to ion implantation to damage a crystal lattice known in the art. Use may be made of another method where a dopant is excessively diffused in the opposite surface to thereby deform the crystal lattice.

When a heat treatment is carried out, a number of crystal defects are induced in the opposite surface of the silicon substrate whose crystal lattice has been damaged by any of the above-mentioned methods. As a result, the contaminants are trapped in these crystal defects.

To remove the contaminants, use may be made of another process which will later be described referring to the drawing.

In each of the conventional methods, removal of the contaminants is restricted to those trapped in the oxygen and can not be sufficient. In particular, in case of a structure including a portion preliminarily covered by an oxidation film relatively thick, it is difficult to remove the contaminants trapped in the oxidation film.

Most of the contaminants trapped in the oxidation film are those existent in the particular area of the silicon substrate. Accordingly, the contaminants present in a relatively deep area can not sufficiently be removed.

Furthermore, when the oxygen is present as a precipitated oxygen in the particular area of the silicon substrate, the contaminants are trapped in the precipitated oxygen. Accordingly, the contaminants still remain in the particular area even after the oxidation film is removed.

SUMMARY OF THE INVENTION

It is an object of the present invention to provide a method of manufacturing a semiconductor device from a silicon substrate, which can readily remove contaminants from the silicon substrate.

Other objects of this invention will become clear as the description proceeds.

According to this invention, there is provided a method of manufacturing a semiconductor device from a silicon substrate. The silicon substrate has a principal surface for use in forming a circuit element. The method comprises the steps of oxidizing the principal surface of the silicon substrate to produce an oxidation film, forming a polycrystalline silicon film on the oxidation film, and deleting the oxidation film and the polycrystalline silicon film.

BRIEF DESCRIPTION OF THE DRAWING

FIGS. 3a to 3d are views for describing a process of manufacturing a semiconductor device according to a first embodiment of this invention;

FIGS. 5a to 5f are views for describing a process of manufacturing a semiconductor device according to a third embodiment of this invention;

FIGS. 9a to 9g are views for describing a process of manufacturing a semiconductor device according to a seventh embodiment of this invention.

DESCRIPTION OF THE PREFERRED EMBODIMENTS

Figure 1A:
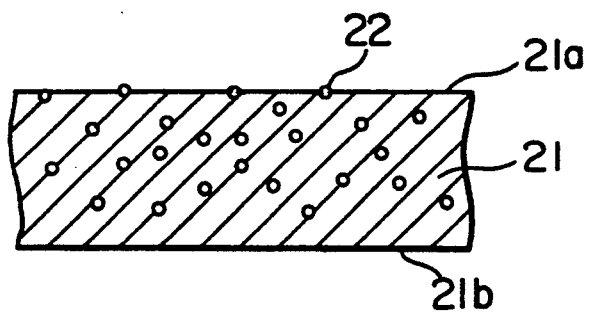
FIGS. 1a to 1c are views for describing a process of manufacturing a semiconductor device in prior art.
Figure 1B:
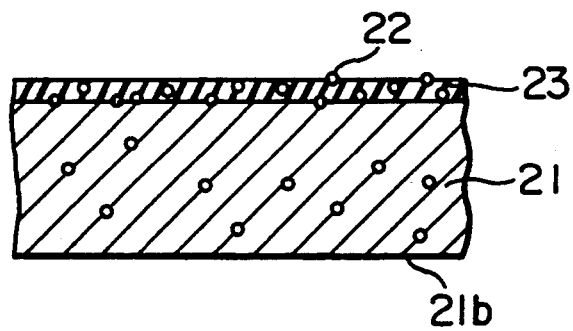
Figure 1C:
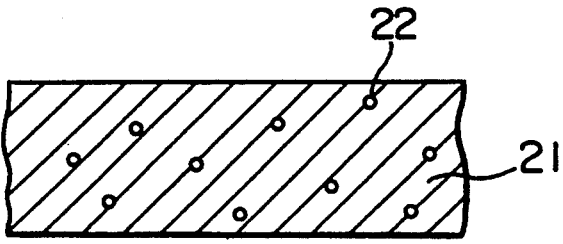

Referring to FIG. 1, description will be made as regards a first conventional method of manufacturing a semiconductor device for a better understanding of the present invention.

As illustrated in a sectional view labelled (a), a single-crystal silicon substrate 21 is prepared at first and has an upper or principal surface 21a and a lower or opposite surface 21b opposite to the principal surface 21a. The silicon substrate 21 includes a particular area, namely, a circuit element forming area adjacent to the principal surface 21a. The particular area is for being formed with a circuit element in the manner known in the art. It will be assumed that contaminants such as 22, such as heavy metal, are existent in the silicon substrate 21.

The principal surface 21a of the silicon substrate 21 is oxidized to produce an oxidation film 23 as illustrated in a sectional view labelled (b). The oxidation film 23 has a thickness of about 400 angstroms. For example, wet oxidation is carried out at 950° C. to form the oxidation film 23. In this event, the oxidation film 23 traps that particular ones of the contaminants 22 which are existent in the particular area of the silicon substrate 21.

The oxidation film 23 is etched by hydrofluoric acid aqueous solution. As a result, the oxidation film 23 is removed as illustrated in a sectional view labelled (c). Thereafter, the silicon substrate 21 is formed with the circuit element in the manner known in the art.

Figure 2A:
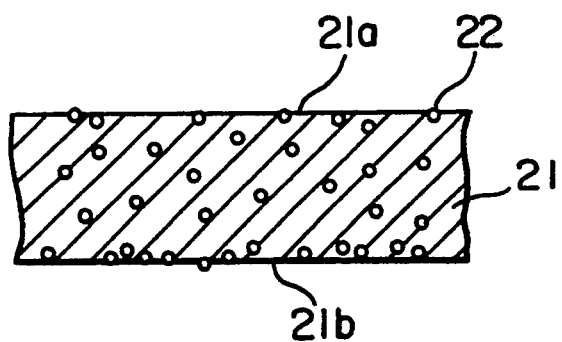
FIGS. 2a to 2c are views for describing another process of manufacturing a semiconductor device in prior art.
Figure 2B:
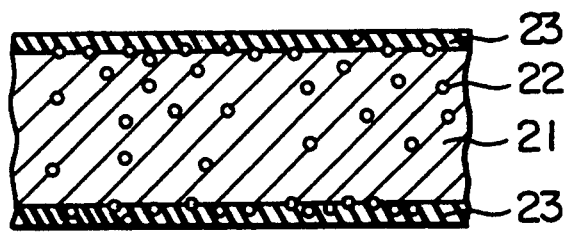
Figure 2C:
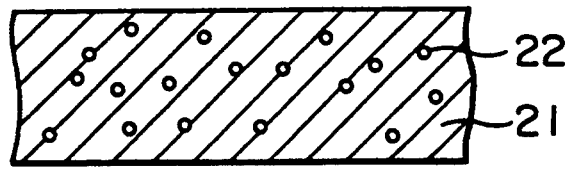
Figure 4A:
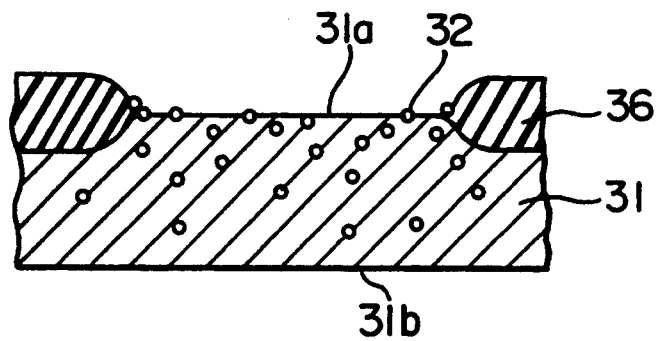
FIGS. 4a to 4d are views for describing a process of manufacturing a semiconductor device according to a second embodiment of this invention.
Figure 4B:
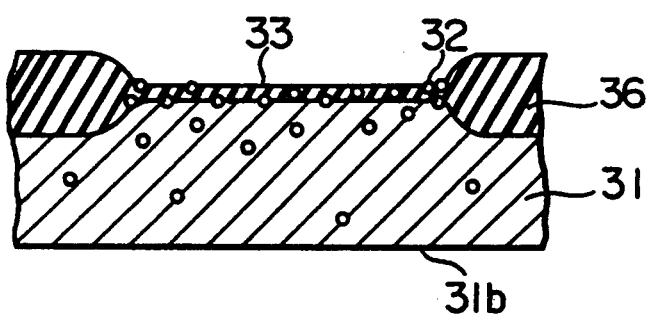
Figure 4C:
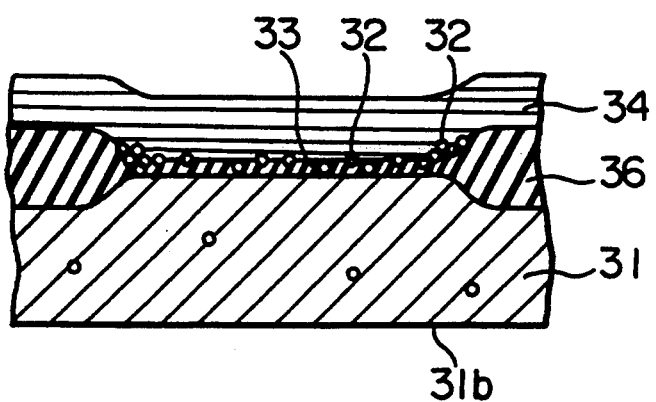
Figure 4D:
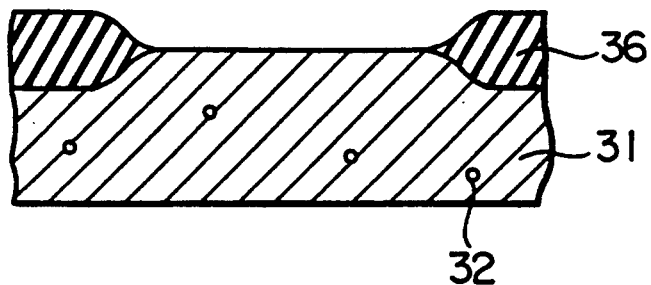
Figure 6A:
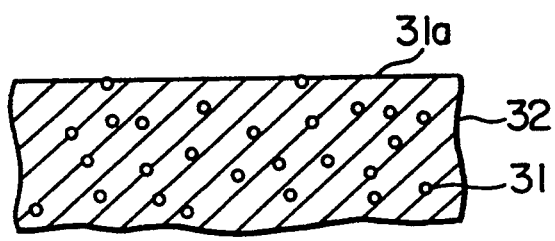
FIGS. 6a to 6g are views for describing a process of manufacturing a semiconductor device according to a fourth embodiment of this invention.
Figure 6B:
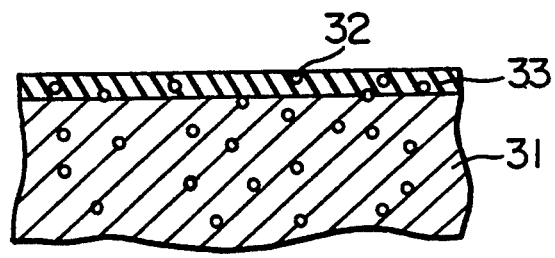
Figure 6C:
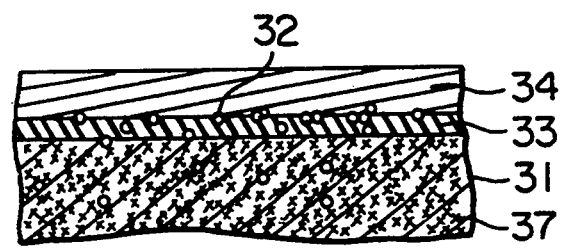
Figure 6D:
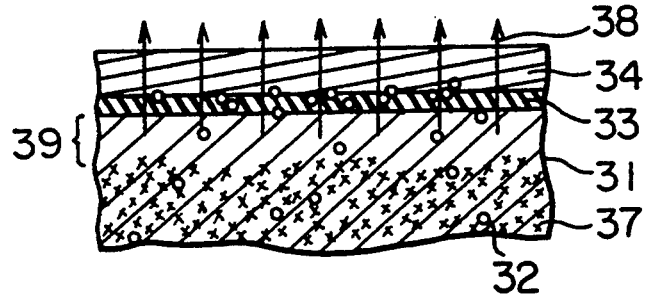
Figure 6E:
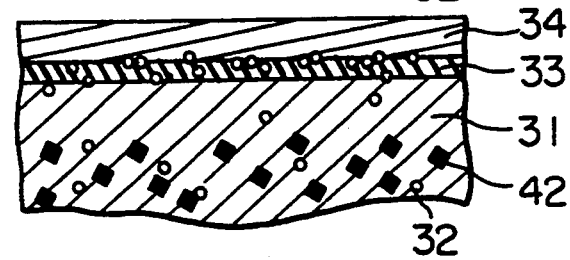
Figure 6F:
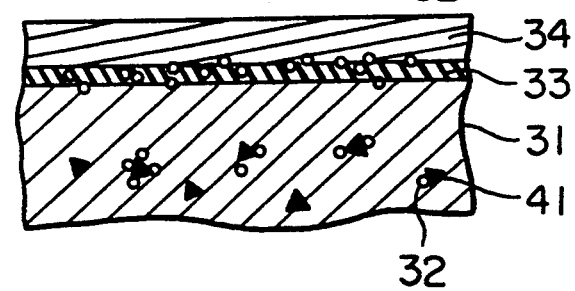
Figure 6G:
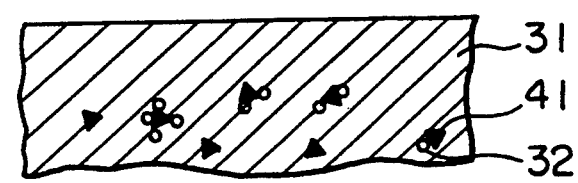
Figure 7A:
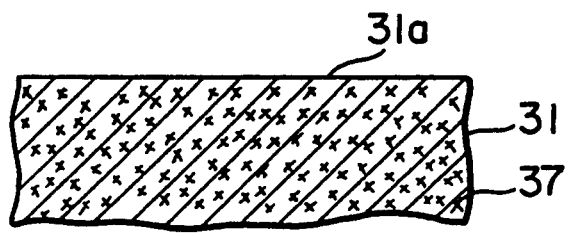
FIGS. 7a to 7g are views for describing a process of manufacturing a semiconductor device according to a fifth embodiment of this invention.
Figure 7B:
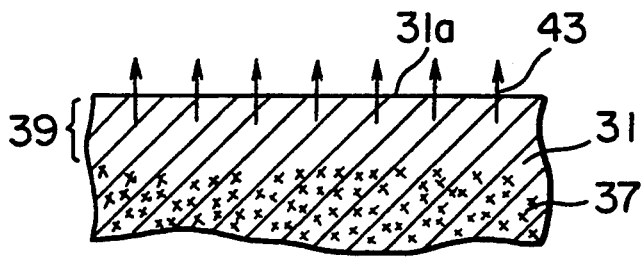
Figure 7C:
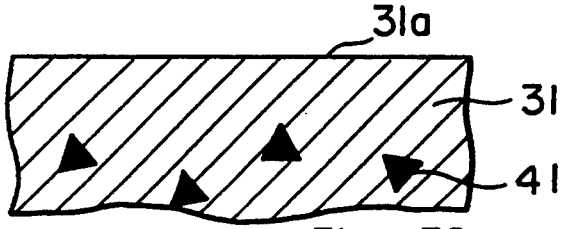
Figure 7D:
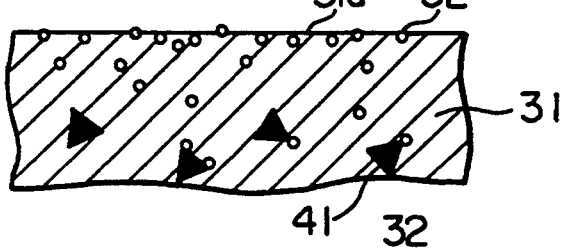
Figure 7E:
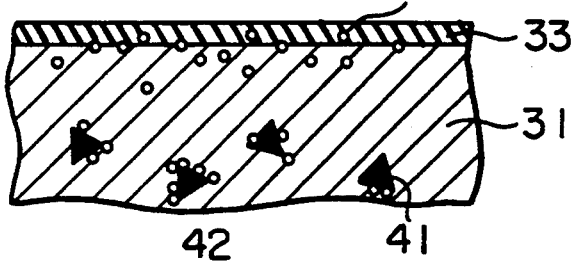
Figure 7F:
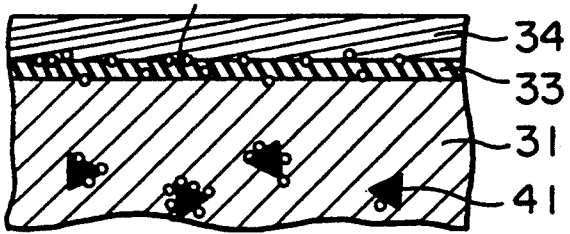
Figure 7G:
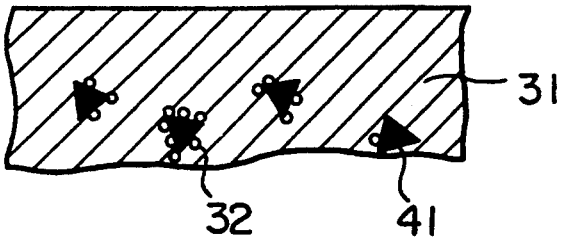
Figure 8A:
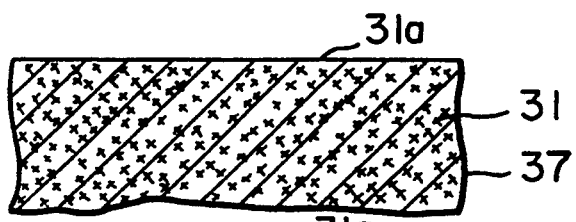
FIGS. 8a to 8h are views for describing a process of manufacturing a semiconductor device according to a sixth embodiment of this invention.
Figure 8B:
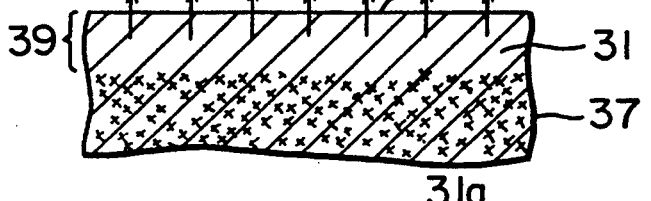
Figure 8C:
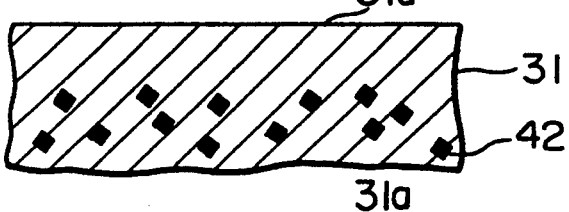
Figure 8D:
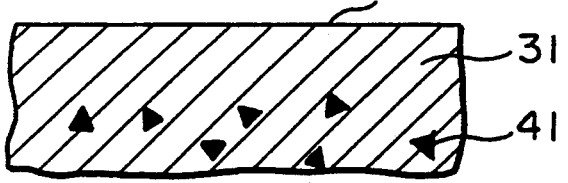
Figure 8E:
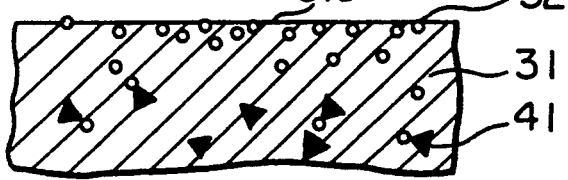
Figure 8F:
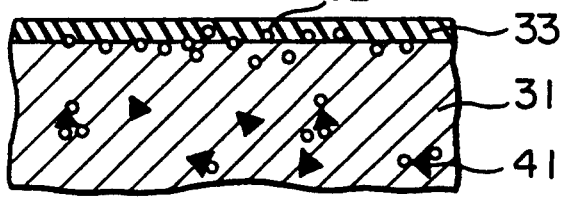
Figure 8G:
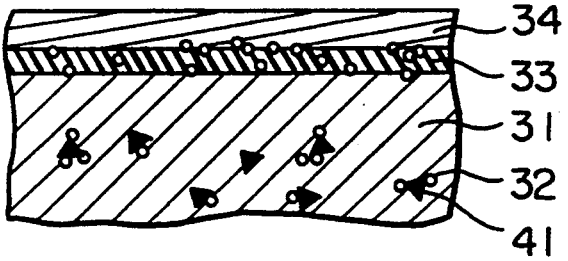
Figure 8H:
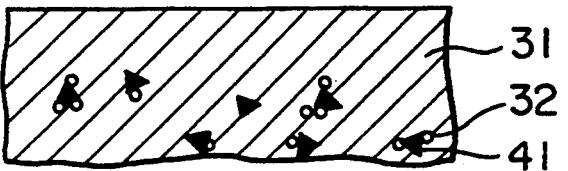
Figure 10A:
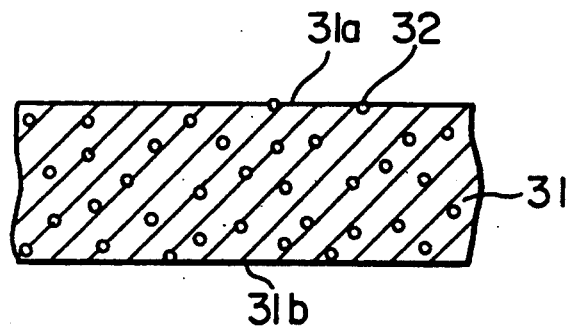
FIGS. 10a to 10d are views for describing a process of manufacturing a semiconductor device according to an eighth embodiment of this invention.
Figure 10B:
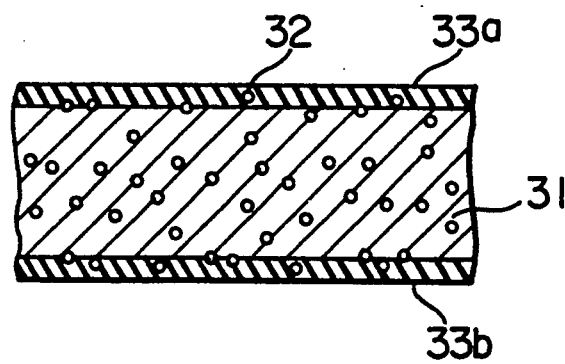
Figure 10C:
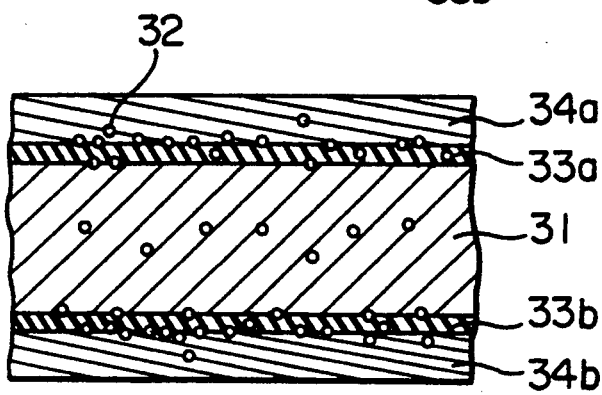
Figure 10D:
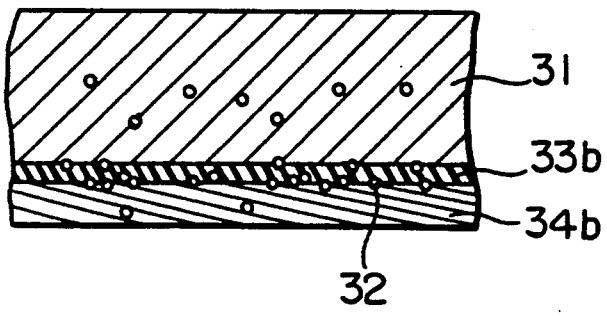

Turning to FIG. 2, the description will be directed to a second conventional method of manufacturing the semiconductor device. Similar parts are designated by like reference numerals.

As illustrated in a sectional view labelled (a), the silicon substrate 21 is prepared at first. The principal and the opposite surfaces 21a and 21b of the silicon substrate 21 are oxidized to produce the oxidation films 23 as illustrated in a sectional view labelled (b). Each of the oxidation films 23 has a thickness of about 400 angstroms. For example, wet oxidation is carried out at 950° C. to form the oxidation films 23. In this event, each of the oxidation films 23 traps the contaminants 22.

The oxidation films 23 are etched by hydrofluoric acid aqueous solution. As a result, the oxidation films 23 are removed from the silicon substrate 21 as illustrated in a sectional view labelled (c). Thereafter, the silicon substrate 21 is formed with the circuit element in the manner known in the art.

Turning to FIG. 3, the description will now be directed to a semiconductor device manufacturing method according to a first embodiment of this invention.

As illustrated in a sectional view labelled (a), a single-crystal silicon substrate 31 is prepared at first. The silicon substrate 31 has an upper or principal surface 31a and a lower or opposite surface 31b opposite to the principal surface 31a and includes a particular area, namely, a circuit element forming area adjacent to the principal surface 31a for being formed with the circuit element in the manner known in the art. It will be assumed that contaminants such as 32, such as heavy metal, are existent in the silicon substrate 31.

The principal surface 31a of the silicon substrate 31 is oxidized to produce an oxidation film 33 as illustrated in a sectional view labelled (b). The oxidation film 33 has a thickness of about 400 angstroms. For example, wet oxidation is carried out at 950° C. to form the oxidation film 33. When the oxidation film 33 is formed on the silicon substrate 31, the contaminants 32 are partly trapped in the oxidation film 33 and in an interface between the oxidation film 33 and the silicon substrate 31.

Next, a polycrystalline silicon film 34 is deposited on the oxidation film 33 to have a thickness of, for example, 4000 angstroms. For example, deposition is carried out at a temperature of 650° C. under a pressure of 1 torr by the use of a silane gas. The flow rate of about 500 sccm is sufficient. Furthermore, the polycrystalline silicon film 34 is subjected to phosphorus diffusion at 850° C. for 60 minutes.

As a consequence, the contaminants 32 are mainly concentrated around the interface between the polycrystalline silicon film 34 and the oxidation film 33, as illustrated in a sectional view labelled (c).

Subsequently, the silicon substrate 31 is deleted with the polycrystalline silicon film 34 and the oxidation film 33 through a wet etching process known in the art. Thus, it is possible to make the particular area of the silicon substrate 31 be remarkably reduced with the contaminants 32 as illustrated in a sectional view labelled (d). Thereafter, the silicon substrate 31 is formed with the circuit element in the manner known in the art.

Turning to FIG. 4, the description will be directed to a semiconductor device manufacturing method according to a second embodiment of this invention. Similar parts are designated by like reference numerals.

As illustrated in a sectional view labelled (a), the method follows the steps similar to those described in conjunction with the foregoing method except isolation oxidation films such as 36 known in the art. Each of the isolation oxidation films 36 will be referred to as a selective oxidation film and is formed on or in a part of the principal surface 31a of the silicon substrate 31 to have a thickness of, for example, 6000 angstroms.

Specifically, the silicon substrate 31 is oxidized to form the oxidation film 33 as illustrated in a sectional view labelled (b). Thereafter, the polycrystalline silicon film 34 is deposited on the oxidation film 33 and then subjected to phosphorus diffusion as illustrated in a sectional view labelled (c).

Subsequently, the polycrystalline silicon film 34 and the oxidation film 33 are deleted together with the contaminants 32 trapped therein as illustrated in a sectional view labelled (d).

In this structure, the presence of the isolation oxidation films 36 provides an unevenness on the upper surface of the silicon substrate 31. This gives rise to further stress concentration so as to facilitate accumulation of the contaminants 32. Heavy metal contaminants 32' readily concentrate to an edge portion of the isolation oxidation film 36. In particular, Fe tends to concentrate on such an oxidation film.

Accordingly, the use of the polycrystalline silicon film 34 provides a greater effect in removal of the contaminants than that attained in the abovementioned method described with reference to FIG. 3.

In each of the methods described in the foregoing, the polycrystalline silicon film 34 is formed on the oxidation film 33 so that the contaminants 32 in the semiconductor substrate 31 are trapped in the interface between the oxidation film 33 and the polycrystalline silicon film 34. As compared with the case of the oxidation film alone, a greater amount of the contaminants 32 can be trapped.

In particular, when the contaminants 32 are removed after a LOCOS (local oxidation of silicon) film is formed as the isolation film 36, a much greater effect is obtained because the heavy metal such as Fe tends to concentrate on the oxidation film 33 at the edge of the LOCOS film.

Turning to FIG. 5, the description will be directed to a semiconductor device manufacturing method according to a third embodiment of this invention. Similar parts are designated by like reference numerals.

As illustrated in a sectional view labelled (a), it is assumed that the silicon substrate 31 contains the impurities or contaminants 32 such as iron and that the contaminants are present on the principal surface 31a and the particular area of the silicon substrate 31.

The principal surface of the silicon substrate 31 is oxidized to produce the oxidation film 33 as illustrated in a sectional view labelled (b). The oxidation film 33 has a thickness of, for example, about 400 angstroms. When the oxidation film 33 is formed, the contaminants 32 are partly trapped in the oxidation film 33 and in an interface between the oxidation film 33 and the silicon substrate 31.

Next, the polycrystalline silicon film 34 is deposited on the oxidation film 33 to have a thickness of, for example, 4000 angstroms. For example, deposition is carried out at a temperature of 650° C. under a pressure of 1 torr by the use of silane gas. The flow rate of about 500 sccm is sufficient. Furthermore, the polycrystalline silicon film 34 is subjected to phosphorus diffusion at a temperature of 820° C. for 60 minutes. As a consequence, the contaminants 32 are mainly concentrated around the interface between the polycrystalline silicon film 34 and the oxidation film 33, as illustrated in a sectional view labelled (c).

In the meanwhile, oxygen atoms 37 are present within the silicon substrate 31. A high-temperature heat treatment is carried out, for example, at 1200° C. for four hours. In this event, the oxygen atoms 37 are outwardly diffused from the particular area of the silicon substrate 31 as shown by arrow marks such as 38 in a sectional view labelled (d). As a result, the oxygen atoms 37 are reduced from the silicon substrate 31. Accordingly, the particular area will be called hereafter a low oxygen concentration area 39. It is to be noted that the low oxygen concentration area 39 does not substantially include the oxygen atoms 37 and may include a small number of the contaminants 32.

Then, a heat treatment is carried out, for example, at 1000° C. for eight hours. In this event, the oxygen atoms 37 are precipitated as oxygen precipitations such as 41 in the silicon substrate 31. The contaminants 32 remaining in the silicon substrate 31 can be trapped in each of the oxygen precipitations 41 as illustrated in a sectional view labelled (e).

The oxygen precipitations 41 are not produced in the low oxygen concentration area 39. Accordingly, the contaminants 32 can be excluded from the particular area, or the circuit element forming area.

The polycrystalline silicon film 34 and the oxidation film 33 are deleted through the wet etching process as illustrated in a sectional view labelled (f). Thus, the contaminants 32 can be removed from the silicon substrate 31 together with the polycrystalline silicon film 34 and the oxidation film 33.

In the method described above, removal of the polycrystalline silicon film 34 and the oxidation film 33 is carried out after completion of an intrinsic gettering process known in the art. However, the removal of the films 34 and 33 may be carried out before or during the heat treatment.

Turning to FIG. 6, the description will be directed to a semiconductor device manufacturing method according to a fourth embodiment of this invention. Similar parts are designated by like reference numerals. The description is omitted as regards sectional views labelled (a) through (d). This is because the description as regards those sectional views are similar to that in the method described above with reference to FIG. 5.

After forming the low oxygen concentration area 39 as illustrated in a sectional view labelled (d), an additional step is incorporated where a low-temperature heat treatment is carried out at a temperature between 600° C. and 800° C. As a result, nuclei are precipitated as precipitation nuclei such as 42 as illustrated in a sectional view labelled (e). In the method exemplified, the low oxygen concentration area 39 has a depth of about 50 μm from the surface of the silicon substrate 31.

More particularly, a heat treatment is carried out as the low-temperature heat treatment at 700° C. for 16 hours. In this event, the precipitation nuclei 42 are formed at a relatively deep position of the silicon substrate 31. Furthermore, another heat treatment is carried out at 1000° C. for eight hours to produce the oxygen precipitations 41 as illustrated in a sectional view labelled (f).

The oxygen depositions 41 are not produced in the low oxygen concentration area 39. Accordingly, the contaminants 32 is trapped in the oxygen precipitations 41 and are also excluded from the low oxygen concentration area 39, namely, the area within 50 μm from the surface of the silicon substrate 31.

Furthermore, the polycrystalline silicon film 34 and the oxidation film 33 are deleted through the wet etching process as illustrated in a sectional view labelled (g). Thus, the contaminants trapped in the polycrystalline silicon film 34 and the oxidation film 33 can be eliminated from the silicon substrate 31. The polycrystalline silicon film 34 and the oxidation film 33 may be deleted before or during the intrinsic gettering process.

Turning to FIG. 7, the description will be directed to a semiconductor device manufacturing method according to a fifth embodiment of this invention. Similar parts are designated by like reference numerals.

As illustrated in a sectional view labelled (a), the silicon substrate 31 is prepared at first. It is assumed that the silicon substrate 31 contains the oxygen atoms 37.

As regards the silicon substrate 31, a heat treatment is carried out, for example, at 1200° C. for four hours. In this event, the oxygen atoms 37 are outwardly diffused from the particular area of the silicon substrate 31 through the principal surface 31a as shown by arrow marks such as 43 in a sectional view labelled (b). As a result, the low oxygen concentration area 39 is produced to have a depth of about 500 angstroms from the particular surface 31a of the silicon substrate 31.

Next, another heat treatment is carried out at 1000° C. for eight hours. As a result, the oxygen precipitations 41 are produced in the silicon substrate 31 as illustrated in a sectional view labelled (c). The oxygen precipitations 41 are not produced in the low oxygen concentration area 39 but is produced only in a relatively deep portion of the silicon substrate 31. It is to be noted that the relatively deep portion is sufficiently spaced from the principal surface 31a of the silicon substrate 31.

An example of distribution of the contaminants 32 is illustrated in a sectional view labelled (d). Herein, the contaminants 32 are not trapped in the oxygen precipitations 41 and present on and in the vicinity of the principal surface of the silicon substrate 31.

Next, thermal oxidation is carried out to grow the oxidation film 33 as illustrated in a sectional view labelled (e). The oxidation film 33 has a thickness of, for example, about 400 angstroms. In this event, the contaminants 32 are partly trapped in the oxidation film 33, in the interface between the oxidation film 33 and the silicon substrate 31, and in the oxygen precipitations 41.

Next referring to a sectional view labelled (f), the polycrystalline silicon film 34 is deposited on the oxidation film 33 to have a thickness of, for example, 4000 angstroms. Deposition is carried out, for example, at a temperature of 650° C. under a pressure of 1 torr by the use of silane gas. The flow rate of about 500 sccm is sufficient. Furthermore, the polycrystalline silicon film 34 is subjected to phosphorus diffusion at 820° C. for 60 minutes. As a consequence, the contaminants 32 concentrate around the interface between the polycrystalline silicon film 34 and the oxidation film 33 as well as in the oxygen precipitations 41 present in the silicon substrate 31, as illustrated in a sectional view labelled (f).

Subsequently, the polycrystalline silicon film 34 and the oxidation film 33 are deleted through the wet etching process. Thus, the contaminants 32 are eliminated from the silicon substrate 31 together with the polycrystalline silicon film 34 and the oxidation film 33 as illustrated in a sectional view labelled (g). The oxygen precipitations 41 are present only in the relatively deep portion that is sufficiently spaced from the circuit element forming area. Accordingly, it is possible to eliminate the contaminants 32 and the crystal defects such as the oxygen precipitations 41 from the circuit element forming area.

Turning to FIG. 8, the description will be directed to a semiconductor device manufacturing method according to a sixth embodiment of this invention. Similar parts are designated by like reference numerals.

As illustrated in a sectional view labelled (a), the silicon substrate 31 is prepared at first. It is assumed that the silicon substrate 31 contains the oxygen atoms 37.

As regards the silicon substrate 31, a heat treatment is carried out, for example, at 1200° C. for four hours. In this event, the oxygen atoms 37 are outwardly diffused from the particular area of the silicon substrate 31 through the principal surface 31a as shown by the arrow marks 43 in a sectional view labelled (b). As a result, the low oxygen concentration area 39 is produced to have a depth of about 50 μm from the principal surface 31a of the silicon substrate 31.

Next, another heat treatment is carried out within a range between 600° and 800° C., preferably at 700° C., for sixteen hours. In this event, the precipitation nuclei 42 are precipitated as illustrated in a sectional view labelled (c).

In addition, still another heat treatment is carried out at 1000° C. for eight hours. As a result, the oxygen precipitations 41 are produced in the silicon substrate 31 as illustrated in a sectional view labelled (d). The oxygen precipitations 41 are not produced in the low oxygen concentration area 39 but is produced only in the relatively deep portion of the silicon substrate 31.

An example of distribution of the contaminants 32 is illustrated in a sectional view labelled (e). Herein, the contaminants 32 are not trapped in the oxygen precipitations 41 and present on and in the vicinity of the principal surface of the silicon substrate 31.

Next, thermal oxidation is carried out to grow the oxidation film 33. The oxidation film 33 has a thickness of, for example, about 400 angstroms. In this event, the contaminants 32 are partly trapped in the oxidation film 33, in the interface between the oxidation film 33 and the silicon substrate 31, and in the oxygen precipitations 41 as illustrated in a sectional view labelled (f).

Next referring to a sectional view labelled (g), the polycrystalline silicon film 34 is deposited on the oxidation film 33 to have a thickness of, for example, 4000 angstroms. Deposition is carried out, for example, at a temperature of 650° C. under a pressure of 1 torr by the use of silane gas. The flow rate of about 500 sccm is sufficient. Furthermore, the polycrystalline silicon film 34 is subjected to phosphorus diffusion at 820° C. for 60 minutes. As a consequence, the contaminants 32 concentrate around the interface between the polycrystalline silicon film 34 and the oxidation film 33 as well as in the oxygen precipitations 41 present in the silicon substrate 31.

Subsequently, the polycrystalline silicon film 34 and the oxidation film 33 are deleted through the wet etching process. Thus, the contaminants 32 are eliminated from the silicon substrate 31 together with the polycrystalline silicon film 34 and the oxidation film 33 as illustrated in a sectional view labelled (g). The oxygen precipitations 41 are present only in the relatively deep portion that is sufficiently spaced from the circuit element forming area. Accordingly, it is possible to eliminate the contaminants 32 and the crystal defects such as the oxygen precipitations 41 from the circuit element forming area.

In the method described with reference to FIG. 8, after the low oxygen concentration area 39 is formed in the vicinity of the principal surface 31a of the silicon substrate 31, the heat treatment is carried out at a relatively low temperature between 600° C. and 800° C. to produce the precipitation nuclei 42. Thus, the oxygen precipitations 41 can be produced with an improved controllability. It is therefore possible to effectively reduce the contaminants 32 and the crystal defects such as the oxygen precipitations 41 in the circuit element forming area.

Throughout the above-mentioned methods, the polycrystalline silicon film 34 is formed on the oxidation film 33 so that the contaminants 32 can be trapped from the silicon substrate 31 in the interface between the oxidation film 33 and the polycrystalline silicon film 34. Accordingly, as compared with the case of the oxidation film 33 alone, a greater amount of the contaminants 32 can be trapped.

Furthermore, a heat treatment for intrinsic gettering is carried out. If carried out before formation of the oxidation film 33 and the polycrystalline silicon film 34, the oxygen precipitations 41 can be eliminated from the circuit element forming area of the silicon substrate 31. The contaminants 32 present in the relatively deep portion of the silicon substrate 31 are removed also and trapped outside of the circuit element forming area. Thus, a greater effect is obtained. It is also possible to reduce the contaminants 32 trapped in the oxygen precipitations 41 and remaining in the circuit element forming area.

Turning to FIG. 9, the description will be directed to a semiconductor device manufacturing method according to a seventh embodiment of this invention. Similar parts are designated by like reference numerals.

As illustrated in a sectional view labelled (a), the silicon substrate 31 is obtained from single-crystal silicon ingot through cutting, grinding, and etching processes in the manner known in the art. By the use of a sandblasting technique known in the art, the opposite surface 31b is given a sandblast damage 44 as illustrated in a sectional view labelled (b).

Next, the silicon substrate 31 is heated and insulated at 600° C. in an Ar gas atmosphere. An excimer laser beam is emitted from a laser source of XeCl (xenon chloride) and irradiated onto the sandblast damage 44 at a laser energy density of 0.2 J/cm$^2$ pulse. The silicon substrate 31 has a portion which is melted to have a depth of 0.2 μm and to form a laser-annealed layer 45 as illustrated in a sectional view labelled (c).

Thereafter, the silicon substrate 31 is cooled down to a decreased temperature. The principal surface 31a of the silicon substrate 31 is polished into a mirror surface.

It is assumed that the silicon substrate 31 contains the contaminants 32 in the silicon substrate 31. An example of distribution of the contaminants 32 is illustrated in a sectional view labelled (d).

The silicon substrate 31 is subjected to thermal oxidation. In this event, the principal and the opposite surfaces 31a and 31b of the silicon substrate 31 are oxidized to form the oxidation films 33 as illustrated in a sectional view labelled (e).

Thereafter, the polycrystalline silicon films 34 are deposited on the oxidation films 33 as illustrated in a sectional view labelled (f). Then, the polycrystalline silicon films 34 are subjected to phosphorus diffusion. The contaminants 32 concentrate around the interface between each of the polycrystalline silicon films 34 and each of the oxidation films 33, in the laser-annealed layer 45, and in the sandblast damage 44.

The polycrystalline silicon film 34 and the oxidation film 33 are deleted by the wet etching process as illustrated in a sectional view labelled (g). Thus, the contaminants 32 are eliminated from the silicon substrate 31 together with the polycrystalline silicon film 34 and the oxidation film 33.

In the method described above with reference to FIG. 9, the extrinsic gettering is carried out by the use of the sandblasting technique and the laser damaging method. Alternatively, use may be made of other backside damaging methods, ion implantation methods of carrying out ion implantation in the opposite surface to damage a crystal lattice, or methods of excessively diffusing a dopant in the opposite surface to deform the crystal lattice.

A yet greater effect is obtained by incorporating an additional step of eliminating the oxygen precipitations 41 in the vicinity of each of the principal and the opposite surfaces. In the additional step, a heat treatment for intrinsic gettering is carried out which is composed of a combination of a high-temperature heat treatment at a temperature not lower than 1100° C. and a low-temperature heat treatment at a temperature not higher than 800° C.

Turning to FIG. 10, the description will be directed to a semiconductor device manufacturing method according to an eighth embodiment of this invention. Similar parts are designated by like reference numerals.

As illustrated in a sectional view labelled (a), it is assumed that the silicon substrate 31 contains the contaminants 32 in the silicon substrate 31. The principal and the opposite surfaces 31a and 31b of the silicon substrate 31 is oxidized to form upper and lower oxidation films 33a and 33b as illustrated in a sectional view labelled (b). As illustrated in a sectional view labelled (c), upper and lower polycrystalline silicon films 34a and 34b are deposited on the upper and the lower oxidation films 33a and 33b, respectively. Furthermore, the upper and the lower polycrystalline silicon films 34a and 34b are subjected to phosphorus diffusion.

A protection film (not shown) is formed only on the lower polycrystalline silicon film 34b. The upper polycrystalline silicon film 34a and the upper oxidation film 33a are subjected to the wet etching process. Thus, the upper polycrystalline silicon film 34a and the upper oxidation film 33a are exclusively deleted only from the circuit element forming surface illustrated in a sectional view labelled (d). Simultaneously, the contaminants 32 present in a device activation area of the silicon substrate 31 are removed also. On the other hand, the lower polycrystalline silicon film 34b and the lower oxidation film 33b are left at a bottom side of the silicon substrate 31.

By leaving the lower polycrystalline silicon film 34b utilized as a getter sink known in the art, the contaminants 32 are eliminated from the device activation area. In this event, the effect of removal of the contaminants 32 is continued in the subsequent steps after removal of the upper polycrystalline silicon film 34 and the upper oxidation film 33.

According to the method described above with reference to FIG. 10, the upper and the lower polycrystalline silicon films 34a and 34b are formed on the upper and the lower oxidation films 33a and 33b so that the contaminants 32 can be trapped from the silicon substrate 31 in the interface between each of the upper and the lower oxidation films 33a and 33b and the upper and the lower polycrystalline silicon films 34a and 34b. As compared with the case of the oxidation film alone, a greater amount of the contaminants 32 can be trapped and eliminated from the device activation area.

In particular, when the contaminants 32 are removed after the LOCOS film is formed as each of the isolation oxidation films, a much greater effect is obtained because the heavy metal such as iron tends to concentrate at the edge of the LOCOS film.

In addition, by carrying out the heat treatment for intrinsic gettering or by forming the back surface distortion for extrinsic gettering, it is possible to more effectively reduce the contaminants 32 in the device activation area of the silicon substrate 31.

What is claimed is:

1. A method of manufacturing a semiconductor device from a silicon substrate, said silicon substrate having a principal surface for use in forming a circuit element, said method comprising the steps of:

selectively forming a selective oxidation film at said principal surface of the silicon substrate, said selective oxidation film defining a particular area for formation of said circuit element;

oxidizing said principal surface of the silicon substrate to produce an oxidation film;

forming a polycrystalline silicon film on said oxidation film; and deleting said oxidation film and said polycrystalline silicon film.

2. A method as claimed in claim 1, further comprising the step of:

subjecting said oxidation film and said polycrystalline silicon film to a heat treatment.

3. A method as claimed in claim 2, wherein said subjecting step comprise the steps of:

heating said oxidation film and said polycrystalline silicon film at a temperature not lower than 1100° C.; and carrying out intrinsic gettering with heating said oxidation film and said polycrystalline silicon film at a temperature not higher than 800° C.

4. A method as claimed in claim 1, further comprising the step of:

diffusing impurities in said polycrystalline silicon film from impurities in said silicon substrate.

5. A method as claimed in claim 1, wherein said silicon substrate has an opposite surface opposite to said principal surface, said method further comprising the step of:

distorting said opposite surface of the silicon substrate before said oxidizing step is carried out.

6. A method as claimed in claim 1, wherein said deleting step comprises the step of:

etching said polycrystalline silicon film only from said particular area that is defined by said selective oxidation film.

* * * * *